(12) United States Patent
Cho

(10) Patent No.: US 8,213,219 B2
(45) Date of Patent: Jul. 3, 2012

(54) TRANSISTOR-BASED MEMORY CELL AND RELATED OPERATING METHODS

(75) Inventor: Hyunjin Cho, Palo Alto, CA (US)

(73) Assignee: Globalfoundries, Inc., Grand Cayman (KY)

( * ) Notice: Subject to any disclaimer, the term of this patent is extended or adjusted under 35 U.S.C. 154(b) by 281 days.

(21) Appl. No.: 12/511,759

(22) Filed: Jul. 29, 2009

(65) Prior Publication Data
US 2011/0026313 A1    Feb. 3, 2011

(51) Int. Cl.
| G11C 11/41  | (2006.01) |
| G11C 11/412 | (2006.01) |
| G11C 11/413 | (2006.01) |
| G11C 11/417 | (2006.01) |
| G11C 7/02   | (2006.01) |

(52) U.S. Cl. ..... 365/156; 365/154; 365/202; 365/233.15
(58) Field of Classification Search .................. 365/154, 365/156, 188, 202, 222, 228, 229, 233.15
See application file for complete search history.

(56) References Cited

U.S. PATENT DOCUMENTS
| 6,535,445 B1 | 3/2003 | Lutley |
| 6,614,124 B1 | 9/2003 | Brown et al. |
| 6,639,826 B2 | 10/2003 | Houston |
| 6,731,533 B2 | 5/2004 | Deng et al. |
| 6,920,061 B2 | 7/2005 | Bhavnagarwala et al. |
| 7,359,272 B2 | 4/2008 | Wang et al. |
| 2002/0105825 A1* | 8/2002 | Marshall et al. ............. 365/154 |
| 2005/0276094 A1* | 12/2005 | Yamaoka et al. ............. 365/154 |
| 2007/0211519 A1* | 9/2007 | Thomas et al. ............. 365/154 |

FOREIGN PATENT DOCUMENTS
EP    0 465 200 A1    10/2004

OTHER PUBLICATIONS

Thomas, O., et al. "Ultra Low Voltage Design Considerations of SOI SRAM Memory Cells," Conference and Proceedings/IEEE International Symposium on Circuits and Systems: May 23-26, 2005; Japan; pp. 4094-4097.

(Continued)

Primary Examiner — J. H. Hur
(74) Attorney, Agent, or Firm — Ingrassia Fisher & Lorenz, P.C.

(57) ABSTRACT

A loadless static random access memory cell is provided. The memory cell includes four transistors. The first transistor has a gate terminal corresponding to a word line of the memory cell, a source/drain terminal corresponding to a first bit line of the memory cell, and a drain/source terminal corresponding to a first storage node of the memory cell. The second transistor has a gate terminal corresponding to the word line, a source/drain terminal corresponding to a second bit line of the memory cell, and a drain/source terminal corresponding to a second storage node of the memory cell. The third transistor has a gate terminal coupled to the second storage node, a drain terminal coupled to the first storage node, a source terminal corresponding to a reference voltage, and a body terminal directly connected to the third gate terminal. The fourth transistor has a gate terminal coupled to the first storage node, a drain terminal coupled to the second storage node, a source terminal corresponding to the reference voltage, and a body terminal directly connected to the fourth gate terminal.

19 Claims, 6 Drawing Sheets

OTHER PUBLICATIONS

Takada, K., et al. "A 16Mb 400MHz Loadless CMOS Four-Transistor SRAM MACRO," IEEE Journal of Solid-State Circuits, vol. 35, No. 11, Nov. 1, 2000; pp. 1631-1640.

Assaderaghi, F., et al. "A Dynamic Threshold Voltage MOSFET (DTMOS) for Ultra-Low Voltage Operation," Electron Devices Meeting, 1994. Technical Digest., International San Francisco, CA. Dec. 11-14, 1994. pp. 809-812.

PCT International Search Report for PCT Application PCT/US2010/042934 mailed Oct. 20, 2010.

Masanao Yamoka, et al.,Low Power SRAM Menu for SOC Application Using Yin-Yang-Feedback Memory Cell Technology, 2004 Symposium on VLSI Circuits Digest of Technical Papers, pp. 288-291.

International Preliminary Report on Patentability mailed Feb. 9, 2012 in International Application No. PCT/US2010/042934.

* cited by examiner

TRANSISTOR-BASED MEMORY CELL AND RELATED OPERATING METHODS

TECHNICAL FIELD

Embodiments of the subject matter described herein relate generally to memory cells, memory devices, and associated operating methods. More particularly, embodiments of the subject matter relate to loadless static random access memory (SRAM) cells.

BACKGROUND

SRAM is used in the semiconductor and computer industries because of the combination of speed, low power, and no requirement for refresh. Information can be written into and read out of an SRAM cell faster than with a dynamic random access memory (DRAM) cell, because the transistors of an SRAM cell can be switched faster than capacitors can be charged and drained. A typical SRAM cell includes two or more cross-coupled drive transistors and access transistors that control access to the drive transistors via a word line. Some SRAM cells use two access transistors and four drive transistors, and these SRAM cells are known as 6T cells. Other SRAM cells use two access transistors and two drive transistors, and these SRAM cells are known as 4T cells. 4T SRAM cells have gained favor because they require less physical space (per unit of memory) than 6T SRAM cells.

BRIEF SUMMARY

An embodiment of a memory cell is provided. The memory cell includes a first transistor having a first gate terminal corresponding to a word line of the memory cell, a first source/drain terminal corresponding to a first bit line of the memory cell, and a first drain/source terminal corresponding to a first storage node of the memory cell. The memory cell also includes a second transistor having a second gate terminal corresponding to the word line of the memory cell, a second source/drain terminal corresponding to a second bit line of the memory cell, and a second drain/source terminal corresponding to a second storage node of the memory cell. The memory cell also includes a third transistor and a fourth transistor. The transistor has a third gate terminal coupled to the second storage node, a third drain terminal coupled to the first storage node, a third source terminal corresponding to a reference voltage, and a third body terminal directly connected to the third gate terminal. The fourth transistor has a fourth gate terminal coupled to the first storage node, a fourth drain terminal coupled to the second storage node, a fourth source terminal corresponding to the reference voltage, and a fourth body terminal directly connected to the fourth gate terminal.

Also provided is a method of operating a memory device. The method provides a memory cell having a first PMOS access transistor, a second PMOS access transistor, a first NMOS drive transistor, and a second NMOS drive transistor. The first PMOS access transistor has a first gate terminal coupled to a word line of the memory device, a first source/drain terminal coupled to a first bit line of the memory device, and a first drain/source terminal corresponding to a first storage node of the memory cell. The second PMOS access transistor has a second gate terminal coupled to the word line, a second source/drain terminal coupled to a second bit line of the memory device, and a second drain/source terminal corresponding to a second storage node of the memory cell. The third NMOS drive transistor has a third gate terminal coupled to the second drain/source terminal, a third drain terminal coupled to the first drain/source terminal, a third source terminal coupled to a reference voltage, and a third body terminal directly connected to the third gate terminal. The fourth NMOS drive transistor has a fourth gate terminal coupled to the first drain/source terminal, a fourth drain terminal coupled to the second drain/source terminal, a fourth source terminal coupled to the reference voltage, and a fourth body terminal directly connected to the fourth gate terminal. The method continues by entering a standby state of the memory cell. This standby state is achieved by asserting a leakage-inducing voltage at the word line, asserting a first standby voltage at the first bit line, and asserting a second standby voltage at the second bit line. The first standby voltage is higher than the leakage-inducing voltage, and the second standby voltage is higher than the leakage-inducing voltage.

A method of operating a loadless 4T memory cell in a standby state is also provided. The memory cell includes two PMOS access transistors and two cross-coupled NMOS drive transistors, each of the NMOS drive transistors having its gate terminal directly connected to its body terminal, and each of the NMOS drive transistors having its source terminal coupled to ground. The method involves: asserting a leakage-inducing voltage at a word line of the memory cell, the word line coupled to the gate terminals of the PMOS access transistors, wherein the leakage-inducing voltage causes the PMOS access transistors to leak current; asserting a first standby voltage at a first bit line of the memory cell, the first bit line coupled to a first source/drain terminal of one of the two PMOS access transistors, the first standby voltage being higher than the leakage-inducing voltage; and asserting a second standby voltage at a second bit line of the memory cell, the second bit line coupled to a second source/drain terminal of the other one of the two PMOS access transistors, the second standby voltage being higher than the leakage-inducing voltage.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
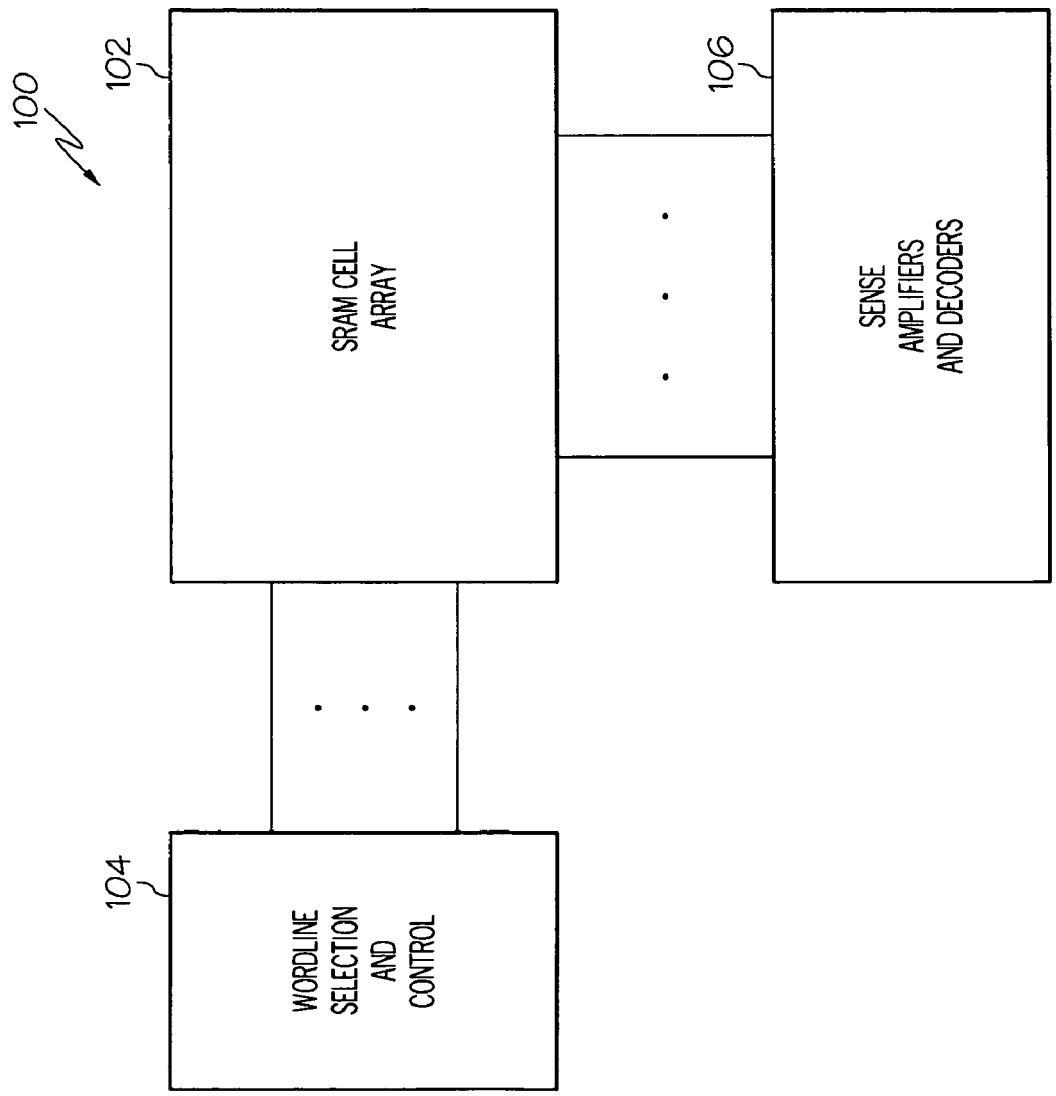
FIG. 1 is a schematic representation of an exemplary embodiment of an SRAM memory system.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to transistor design and manufacturing, the control of memory devices, memory cell reading and writing, and other functional aspects of the devices and systems (and the individual operating components of the devices and systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. In addition, certain terminology may also be used in the following description for the purpose of reference only, and thus are not intended to be limiting. For example, terms such as "first," "second," and other such numerical terms referring to elements or features do not imply a sequence or order unless clearly indicated by the context.

FIG. 1 is a schematic representation of an exemplary embodiment of an SRAM memory system 100. The system 100 is depicted in an overly simplified manner, and an actual deployment of system 100 will typically include other elements, logic, components, and features not shown in FIG. 1. Briefly, the system 100 is suitably configured to facilitate writing and reading of data (bits) to and from an SRAM cell array 102. In this regard, the memory cells within the SRAM cell array 102 can be configured as loadless 4T SRAM cells (as described in more detail below), where each cell stores the equivalent of one bit (i.e., a logic high value or state, or a logic low value or state). It is to be appreciated that the SRAM cell array 102 could be realized in any number of different configurations, for example, between 1,000 to 1,000,000 cells. In addition, the cells in the SRAM cell array 102 may be partitioned into any number of sectors (within practical limitations).

The illustrated embodiment of the system 100 includes a word line selection and control module 104 and a sense amplifiers and decoders module 106, each being operatively coupled to the SRAM cell array 102. These modules may cooperate with an address decoder (not shown) for the SRAM cell array 102, which can be used for decoding input and/or output ("I/O") signals during various operations that are performed on the SRAM cell array 102 (e.g., writing, reading, standby). For example, the address decoder could receive address bus information from a system controller (not shown) or the like. The address decoder enables the system 100 to select cells for operations using word lines and bit lines, as is well understood by those familiar with SRAM memory devices. Thus, the system 100 can leverage known addressing and switching techniques to select a desired target cell (or a plurality of target cells) in the SRAM cell array 102 for writing, reading, etc.

The word line selection and control module 104 is utilized to select designated word lines of the SRAM cell array 102 as needed, and to assert appropriate word line voltages to the selected word lines. For example, the word line selection and control module 104 can select a word line and assert an appropriate voltage at the selected word line (e.g., a write voltage to support a write operation, a read voltage to support a read operation, a standby voltage to support a standby state, or the like). The sense amplifiers and decoders module 106 is utilized to select designated bit lines of the SRAM cell array 102 as needed, to assert appropriate bit line voltages to the selected bit lines (when appropriate), and to sense/detect the bit line voltages during read operations. In practice, the system 100 uses the sense amplifiers and decoders module 106 to program the bit states of the cells in the SRAM cell array 102 and to read the programmed bit states of the cells in the SRAM cell array 102.

The system 100 may also include or cooperate with at least one controller (not shown) that receives commands or instructions for invoking various processes and tasks related to writing, reading, and other operations to be described herein. Moreover, the steps of a method or algorithm described in connection with the embodiments disclosed herein may be realized directly in hardware, in firmware, in a software module executed by a processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

Figure 2:
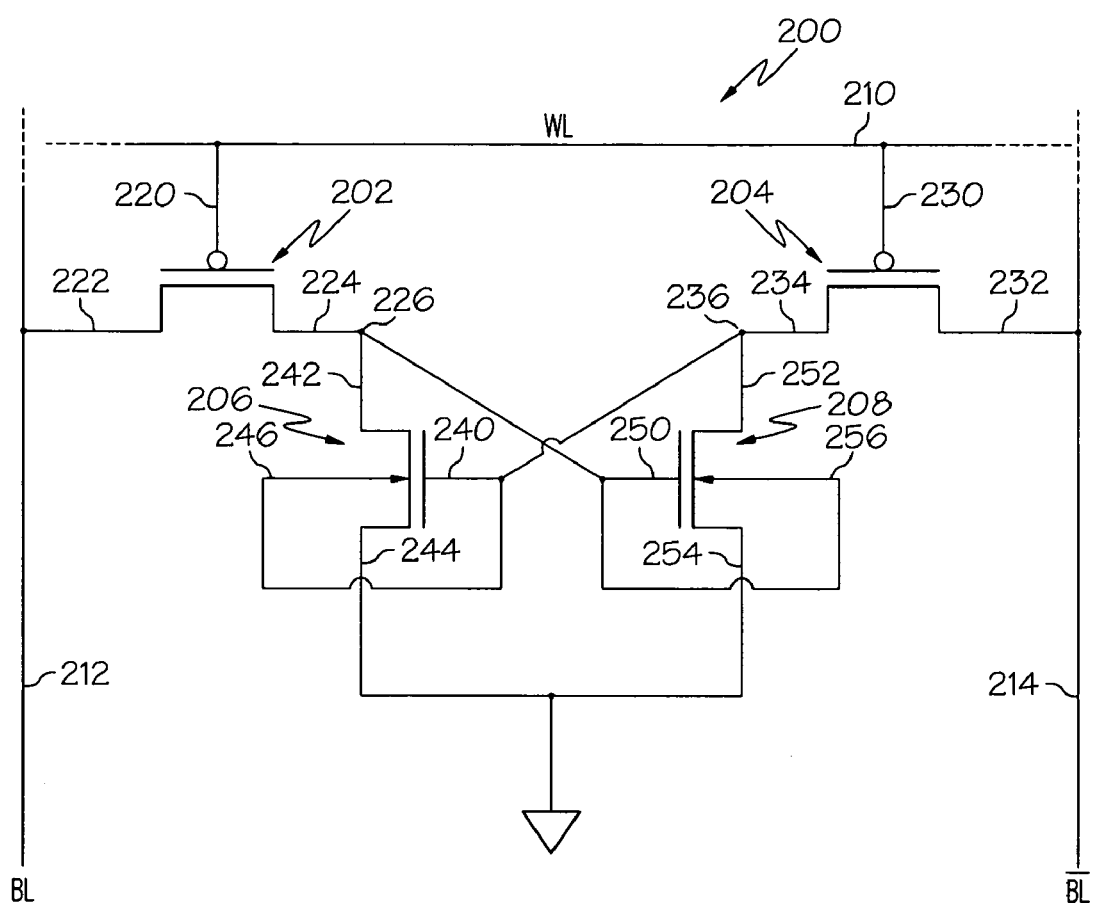
FIG. 2 is a schematic diagram of an exemplary embodiment of a loadless 4T SRAM cell.

FIG. 2 is a schematic diagram of an exemplary embodiment of a loadless 4T SRAM cell 200. In certain embodiments, the SRAM cell array 102 shown in FIG. 1 includes a plurality of these SRAM cells 200. The SRAM cell 200 includes two PMOS access transistors 202/204 and two cross-coupled NMOS drive transistors 206/208. In certain embodiments, all of the transistors in the SRAM cell 200 are formed on a silicon-on-insulator (SOI) substrate. This facilitates use of the body terminal connections (described below) for the two NMOS drive transistors 206/208. The SRAM cell 200 includes or cooperates with a word line 210 and two bit lines 212/214. In typical implementations, the word line 210 will be shared with a plurality of other SRAM cells. Accordingly, a common word line 210 can be used to simultaneously apply voltages to a plurality of different SRAM cells in an array. Similarly, each of the bit lines 212/214 might be shared with a plurality of other SRAM cells. Thus, a bit line 212/214 can be used to simultaneously apply (or sense) voltages corresponding to a plurality of different SRAM cells in the array.

The PMOS access transistor 202 includes a gate terminal (or node) 220, a source/drain terminal (or node) 222, and a drain/source terminal (or node) 224. The terminology "source/drain" and "drain/source" is used here to indicate the symmetric nature of the PMOS access transistor 202. In this regard, if the terminal 222 corresponds to the source of the PMOS access transistor 202, then the terminal 224 will correspond to the drain of the PMOS access transistor 202. Conversely, if the terminal 222 corresponds to the drain of the PMOS access transistor 202, then the terminal 224 will correspond to the source of the PMOS access transistor 202. In practice, the distinction between source and drain here is unimportant, and the PMOS access transistors serve as three-terminal devices in this context.

The gate terminal 220 is coupled to the word line 210 of the SRAM cell 200. For this particular embodiment, the gate terminal 220 corresponds to the word line 210 (and, therefore, the gate terminal 220 is directly connected to the word line 210). The source/drain terminal 222 is coupled to the bit line 212 of the SRAM cell 200. For this particular embodiment, the source/drain terminal 222 corresponds to the bit line 212 (and, therefore, the source/drain terminal 222 is directly connected to the bit line 212). The drain/source terminal 224 is coupled to a first storage node 226 of the SRAM cell 200. For this particular embodiment, the drain/source terminal 224 corresponds to the first storage node 226 (and, therefore, the drain/source terminal 224 is directly connected to the first storage node 226).

The other PMOS access transistor 204 includes a gate terminal (or node) 230, a source/drain terminal (or node) 232, and a drain/source terminal (or node) 234. The gate terminal 230 is coupled to the word line 210 of the SRAM cell 200. For this particular embodiment, the gate terminal 230 corresponds to the word line 210 (and, therefore, the gate terminal 230 is directly connected to the word line 210). The source/drain terminal 232 is coupled to the bit line 214 of the SRAM cell 200. For this particular embodiment, the source/drain terminal 232 corresponds to the bit line 214 (and, therefore, the source/drain terminal 232 is directly connected to the bit line 214). The drain/source terminal 234 is coupled to a second storage node 236 of the SRAM cell 200. For this particular embodiment, the drain/source terminal 234 corresponds to the second storage node 236 (and, therefore, the drain/source terminal 234 is directly connected to the second storage node 236).

The NMOS drive transistor 206 includes a gate terminal (or node) 240, a drain terminal (or node) 242, a source terminal (or node) 244, and a body terminal (or node) 246. The gate terminal 240 is coupled to the second storage node 236 of the SRAM cell 200. For this particular embodiment, the gate terminal 240 corresponds to the second storage node 236 (and, therefore, the gate terminal 240 is directly connected to the second storage node 236). The drain terminal 242 is coupled to the first storage node 226 of the SRAM cell 200. For this particular embodiment, the drain terminal 242 corresponds to the first storage node 226 (and, therefore, the drain terminal 242 is directly connected to the first storage node 226). The source terminal 244 is coupled to a reference voltage, e.g., a ground voltage. The ground voltage may be, for example, zero volts. As depicted in FIG. 2, the body terminal 246 is directly connected to the gate terminal 240. In other words, there are no intervening active or passive circuit elements in the conductive path between the body terminal 246 and the gate terminal 240. Accordingly, in the illustrated embodiment the body terminal 246 is also directly connected to the second storage node 236.

The other NMOS drive transistor 208 includes a gate terminal (or node) 250, a drain terminal (or node) 252, a source terminal (or node) 254, and a body terminal (or node) 256. The gate terminal 250 is coupled to the first storage node 226 of the SRAM cell 200. For this particular embodiment, the gate terminal 250 corresponds to the first storage node 226 (and, therefore, the gate terminal 250 is directly connected to the first storage node 226). The drain terminal 252 is coupled to the second storage node 236 of the SRAM cell 200. For this particular embodiment, the drain terminal 252 corresponds to the second storage node 236 (and, therefore, the drain terminal 252 is directly connected to the second storage node 236). The source terminal 254 is coupled to the reference voltage. Thus, the source terminal 254 of the NMOS drive transistor 208 is coupled to the source terminal 244 of the NMOS drive transistor 206. As depicted in FIG. 2, the body terminal 256 is directly connected to the gate terminal 250. In other words, there are no intervening active or passive circuit elements in the conductive path between the body terminal 256 and the gate terminal 250. Accordingly, in the illustrated embodiment the body terminal 256 is also directly connected to the first storage node 226.

The body terminal connections in the SRAM cell 200 provide positive feedback to the bodies of the NMOS drive transistors 206/208. This results in stable cell operation, particularly in the standby state. The SRAM cell 200 also exhibits a high write margin and a high read margin. In addition, the feedback gain of the SRAM cell 200 is higher than traditional 6T and 4T SRAM cell designs. Moreover, the SRAM cell 200 can be fabricated in a straightforward manner and without requiring complicated or costly process steps.

The SRAM cell 200 can be operated in a way that takes advantage of the body terminal connections and results in enhanced performance and stability. Certain exemplary operating states and modes will now be described with reference to FIGS. 3-8. It should be appreciated that the following examples are not intended to restrict or otherwise limit the application or scope of the described subject matter.

Figure 3:
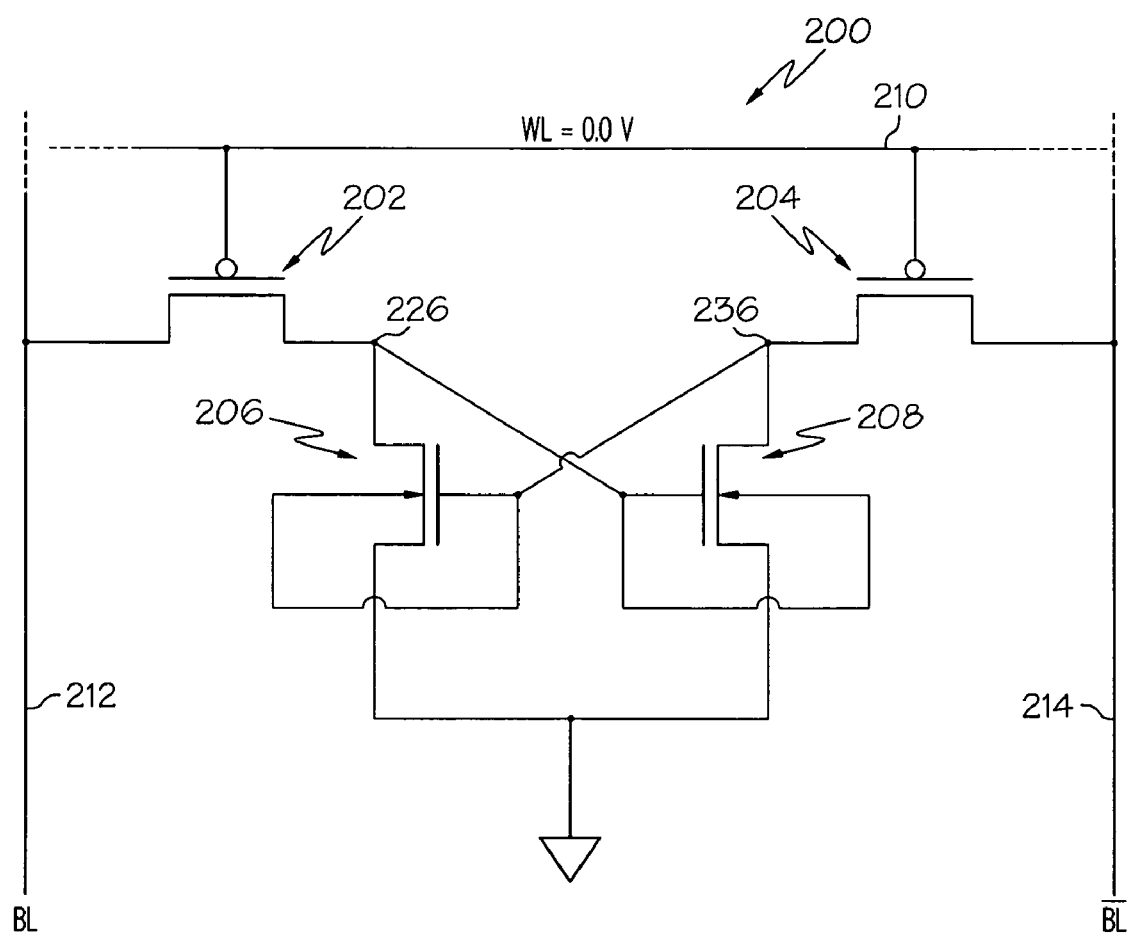
FIG. 3 is a schematic diagram that depicts a read/write state of the loadless 4T SRAM cell of FIG. 2.

FIG. 3 is a schematic diagram that depicts a read/write state of the loadless 4T SRAM cell 200. When a bit is written to the SRAM cell 200, the ground voltage is de-asserted from the word line 210 such that the PMOS access transistors 202/204 turn on and provide access to the NMOS drive transistors 206/208, via the respective bit lines 212/214. Due to the PMOS nature of the PMOS access transistors 202/204, the write voltage asserted at the word line 210 is relatively low, e.g., a ground voltage, zero volts, or any low voltage that results in complete and full activation of the PMOS access transistors 202/204.

If the write operation is intended to write a logic high bit state for the SRAM cell 200, then a high writing voltage is asserted at the bit line 212, and a low writing voltage is asserted at the bit line 214 in a complimentary manner. The active states of the PMOS access transistors 202/204 results in a relatively high voltage at the first storage node 226, and a relatively low voltage at the second storage node 236. This combination of high/low voltage corresponds to the logic high bit state for the SRAM cell 200. If, however, the write operation is intended to write a logic low bit state for the SRAM cell 200, then a low writing voltage is asserted at the bit line 212, and a high writing voltage is asserted at the bit line 214. The active states of the PMOS access transistors 202/204 results in a relatively low voltage at the first storage node 226, and a relatively high voltage at the second storage node 236. This combination of low/high voltage corresponds to the logic low bit state for the SRAM cell 200. When writing a bit to the SRAM cell 200, the high writing voltage will be higher than the low writing voltage. For example, the high writing voltage may be Vdd or a voltage within the range of about 0.7 to 1.5 volts, and the low writing voltage may be within the range of about 0.0 to 0.5 volts.

When a bit is read from the SRAM cell 200, the standby voltage is de-asserted from the word line, and instead an appropriate read voltage is asserted at the word line 210 such that the PMOS access transistors 202/204 turn on and provide access to the NMOS drive transistors 206/208, via the respective bit lines 212/214. Due to the PMOS nature of the PMOS access transistors 202/204, the read voltage asserted at the word line 210 is relatively low, e.g., a ground voltage, zero volts, or any low voltage that results in complete and full activation of the PMOS access transistors 202/204. Indeed, the read voltage could be equal to the write voltage.

When reading from the SRAM cell 200, the voltages present at the first storage node 226 and the second storage node 236 become accessible at the respective bit lines 212/214, due to the activation of the PMOS access transistors 202/204. Referring again to FIG. 1, the sense amplifiers and decoders module 106 can then determine the bit state of the SRAM cell 200 by sensing the voltages at the first storage node 226 and the second storage node 236. When the voltage sensed on the bit line 212 is high (relative to a high detection threshold voltage) and the voltage sensed on the bit line 214 is low (relative to a low detection threshold voltage), then a logic high bit state is read. On the other hand, when the voltage sensed on the bit line 212 is low (relative to a low detection threshold voltage) and the voltage sensed on the bit line 214 is high (relative to a high detection threshold voltage), then a logic low bit state is read.

Figure 4:
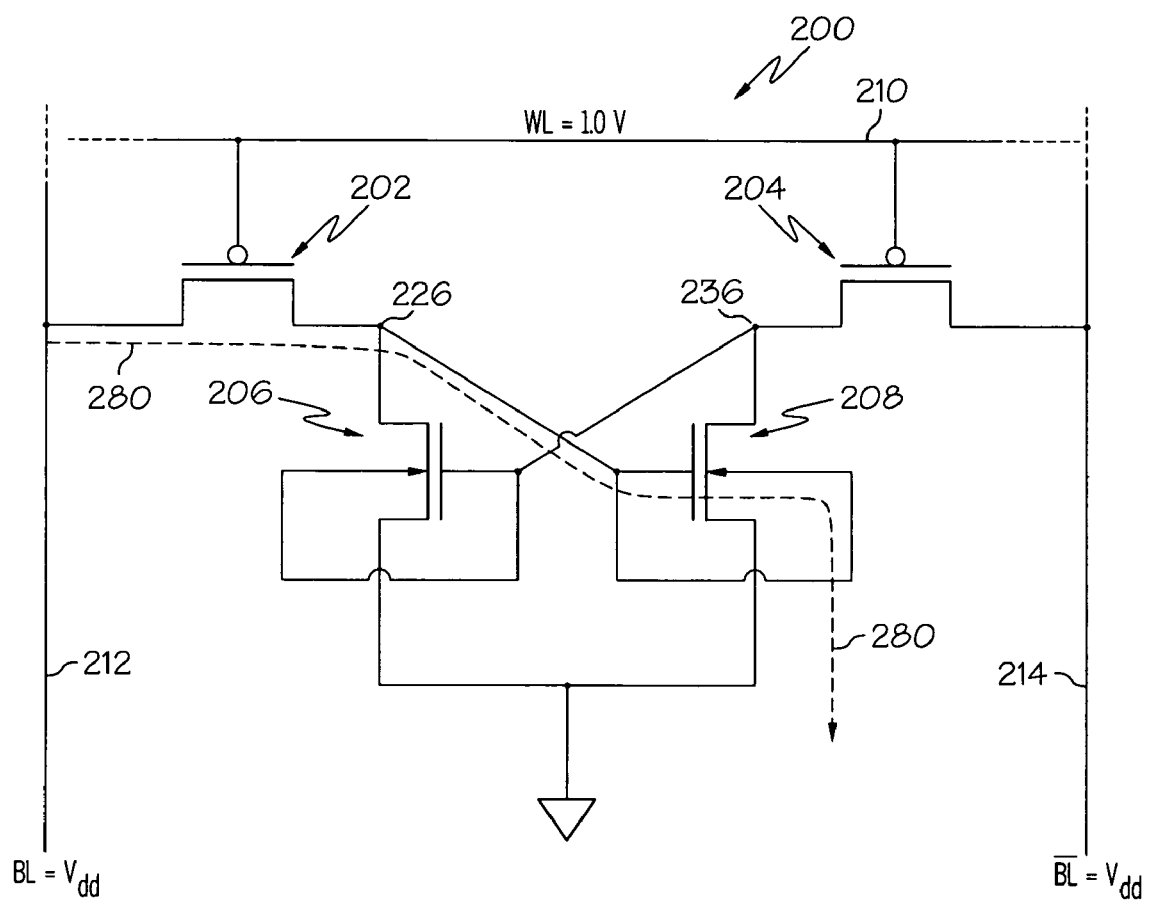
FIG. 4 is a schematic diagram that depicts a standby state of the loadless 4T SRAM cell of FIG. 2, with a word line voltage that results in shutdown of the access transistors.

SRAM cells can also be placed into a standby state during which a bit state is neither being written nor read. In other words, in the standby state the goal is to preserve the current bit state of the SRAM cell. FIG. 4 is a schematic diagram that depicts a standby state of the loadless 4T SRAM cell 200, with a word line voltage that results in shutdown of the PMOS access transistors 202/204.

To enter the standby state depicted in FIG. 4, a first standby voltage is asserted at the bit line 212, a second standby voltage is asserted at the bit line 214, and a relatively high word line voltage is asserted at the word line 210. In typical implementations, the first standby voltage is equal to the second standby voltage. In practice, the first and second standby voltages may be equal to the supply voltage (Vdd) used by the NMOS drive transistors 206/208 or a voltage within the range of about 05. to 1.5 volts. The word line voltage for deactivation of the PMOS access transistors 202/204 will be less than the standby voltage asserted at the bit lines 212/214. For this example, the word line voltage is within the range of about 0.5 to 1.5 volts, and about 1.0 volt in the illustrated embodiment. In operation, the bit lines 212/214 are pre-charged to supply power through the sub-threshold leakage of the PMOS access transistors 202/204. In certain embodiments, the bit lines 212/214 are pre-charged to the supply voltage (Vdd) used by the transistors of the SRAM cell 200. Thus, the PMOS access transistors 202/204 supply the full Vdd voltage during the standby mode.

Figure 5:
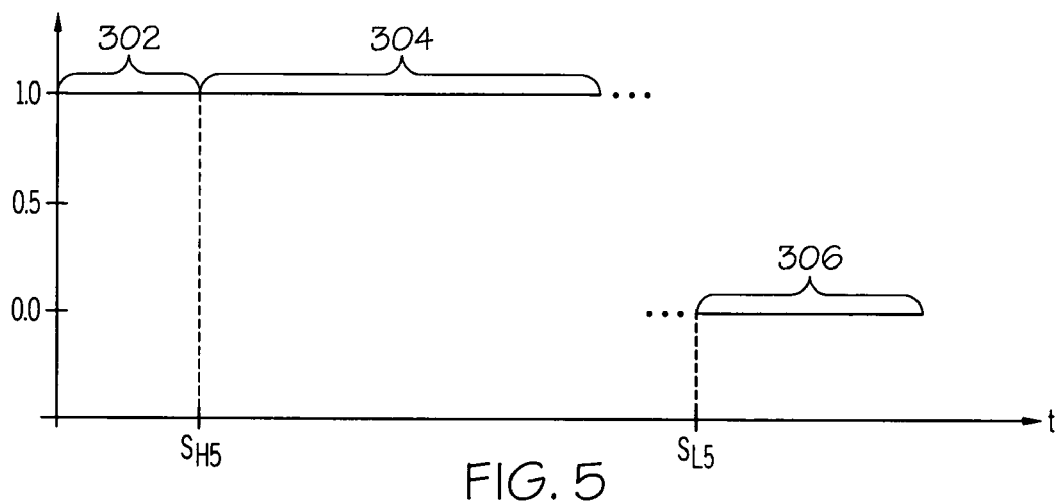
FIG. 5 is a graph that depicts ideal standby voltage characteristics at a storage node of a loadless 4T SRAM cell.

FIG. 5 is a graph that depicts ideal standby voltage characteristics at a storage node of a loadless 4T SRAM cell. The vertical scale represents voltage at the storage node, and the horizontal scale represents time. In FIG. 5, the portion of the plot 302 that occurs before the time $S_{H5}$ corresponds to logic high read/write operations. The time $S_{H5}$ indicates when the SRAM cell transitions to the standby state, and the portion of the plot 304 that occurs after the time $S_{H5}$ corresponds to a standby period during which the SRAM cell stores a logic high bit. Ideally, the storage node retains the initial voltage level (one volt in this example) during this high standby period. The ellipses in FIG. 5 represent a period of time corresponding to logic low read/write operations. The time $S_{L5}$ indicates when the SRAM cell transitions to the standby state, and the portion of the plot 306 that occurs after the time $S_{L5}$ corresponds to a standby period during which the SRAM cell stores a logic low bit. Ideally, the storage node retains its voltage level (zero volts in this example) during this low standby period.

Figure 6:
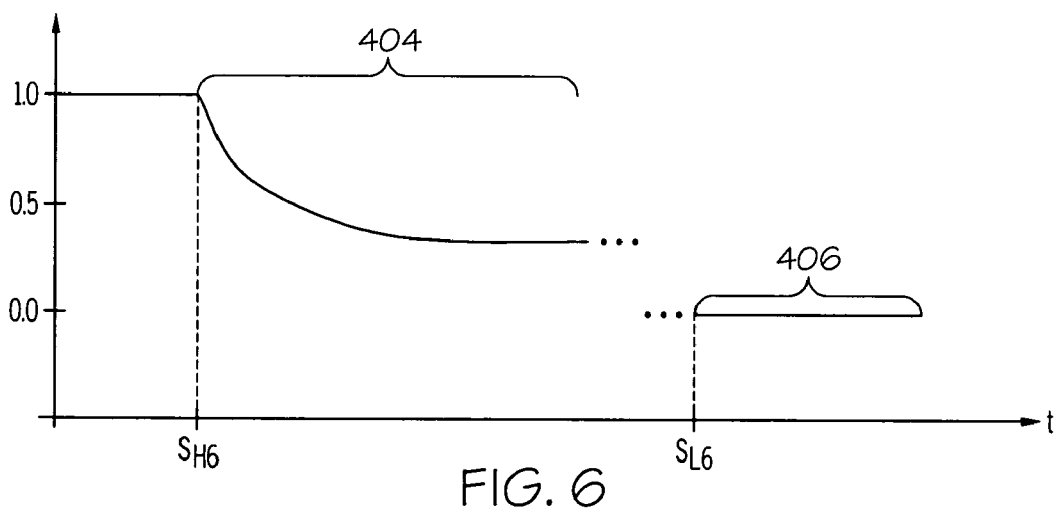
FIG. 6 is a graph that depicts the standby voltage characteristics at a storage node of the loadless 4T SRAM cell shown in FIG. 4.

In practice, the operating conditions depicted in FIG. 4 could lead to undesirable decay in the voltage level present at the first storage node 226 and/or the second storage node 236. If excessive, such decay can cause errors when the SRAM cell 200 is subsequently read. In this regard, FIG. 6 is a graph that depicts the non-ideal standby voltage characteristics at a storage node of the loadless 4T SRAM cell 200, under the conditions shown in FIG. 4. The scale and transition time points used in FIG. 6 are the same as that used in FIG. 5. In FIG. 6, the time $S_{H6}$ indicates when the SRAM cell transitions to the high standby state. As depicted in FIG. 6, the portion of the plot 404 that occurs after the time $S_{H6}$ demonstrates a decaying trend where the voltage quickly drops from the ideal level (one volt) to less than 0.5 volts. In contrast, the time $S_{L6}$ indicates when the SRAM cell transitions to the low standby state, and the portion of the plot 406 that occurs after the time $S_{L6}$ corresponds to the low standby period. Since the low standby voltage at the storage node is initially zero volts, the portion of the plot 406 demonstrates no voltage decay. Consequently, the low voltage level remains stable during standby.

Referring back to FIG. 4, the dashed arrow 280 represents current that flows during the standby mode under the illustrated operating conditions. At standby, the voltage at the first storage node 226 is determined by two currents (voltage divider): the leakage current of the PMOS access transistor 202 and the body diode current of the NMOS drive transistor 208. If the diode current is much higher than the leakage current of the PMOS access transistor 202, then the voltage at the first storage node 226 will approach zero, resulting in the decay characteristic shown in FIG. 6 and, ultimately, retention failure.

Figure 7:
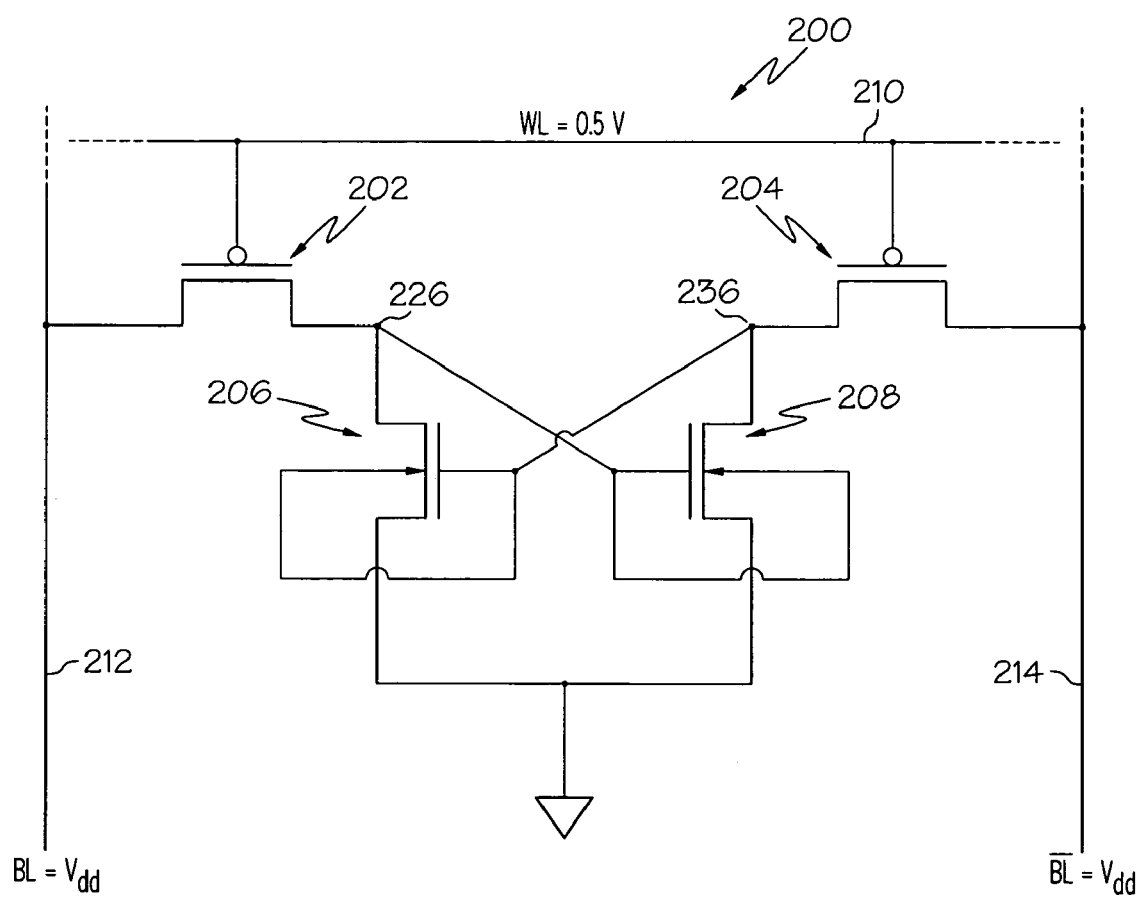
FIG. 7 is a schematic diagram that depicts a standby state of the loadless 4T SRAM cell of FIG. 2, with a reduced word line voltage that results in leaky operation of the access transistors.

The SRAM cell 200 can be operated during standby in a manner that compensates for the undesirable high voltage decay described above. In this regard, FIG. 7 is a schematic diagram that depicts a standby state of the SRAM cell 200, with a reduced word line voltage that results in leaky operation of the PMOS access transistors 202/204. In other words, during standby, the PMOS access transistors 202/204 are intentionally biased such that they are not completely conducting and such that they are not completely shut off.

To enter the standby state depicted in FIG. 7, a first standby voltage is asserted at the bit line 212, a second standby voltage is asserted at the bit line 214, and a leakage-inducing voltage is asserted at the word line 210. In typical implementations, the first standby voltage is equal to the second standby voltage. In practice, the first and second standby voltages may be equal to the supply voltage (Vdd) used by the NMOS drive transistors 206/208 or a voltage within the range of about 0.5 to 1.5 volts. Both the first standby voltage and the second standby voltage will be higher than the leakage-inducing word line voltage. For this example, the leakage-inducing voltage is between 0.0 volts and Vdd. In certain embodiments, the leakage-inducing voltage is approximately equal to $$\frac{Vdd}{2}$$

(in FIG. 7, the leakage-inducing voltage is 0.5 volts). In practice, the specified leakage-inducing voltage may vary from the specified or desired level, due to realistic and reasonable variations in manufacturing and operating parameters.

The leakage-inducing voltage asserted at the word line 210 is selected and applied to cause the PMOS access transistors 202/204 to leak current in the standby state. Notably, the leakage resulting from the leakage-inducing voltage will be measurably higher than the amount of leakage caused by a typical word line voltage that is intended to completely shut down the PMOS access transistors 202/204 (as explained with reference to FIG. 4 and FIG. 6). Indeed, the leakage-inducing voltage is intended to increase the leakage current of the PMOS access transistor 202 such that the diode current of the NMOS drive transistor 208 does not significantly exceed the leakage current. As a result, the high voltage at the first storage node 226 will be retained while the SRAM cell 200 is in the standby state.

Figure 8:
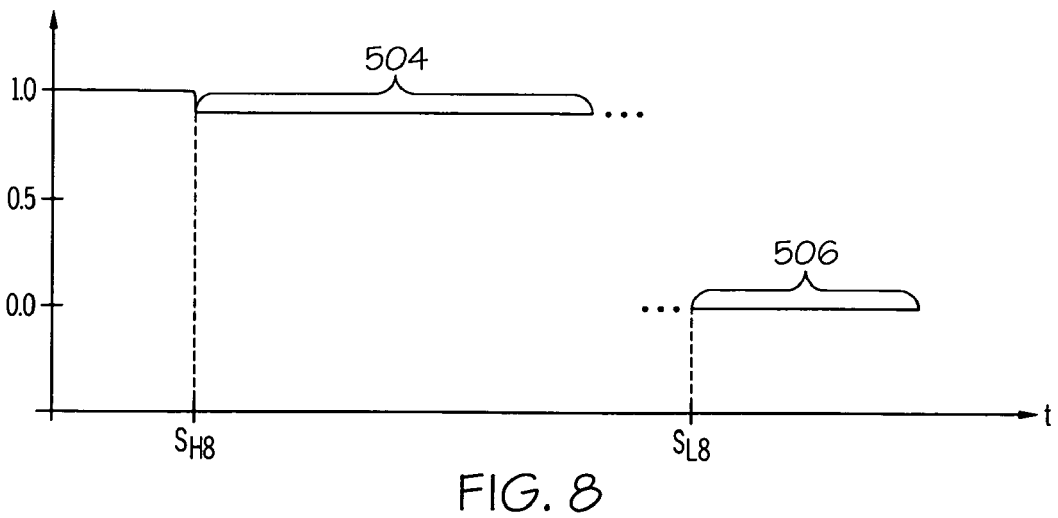
FIG. 8 is a graph that depicts the standby voltage characteristics at a storage node of the loadless 4T SRAM cell shown in FIG. 7.

FIG. 8 is a graph that depicts the standby voltage characteristics at a storage node of the SRAM cell 200 under the conditions depicted in FIG. 7. The scale and transition time points used in FIG. 8 are the same as that used in FIG. 5. In FIG. 8, the time $S_{H8}$ indicates when the SRAM cell transitions to the high standby state. As depicted in FIG. 8, the portion of the plot 504 that occurs after the time $S_{H8}$ demonstrates a slight drop following the transition, but then remains substantially flat and stable throughout the remainder of the high standby period. Compared to the decaying characteristic shown in FIG. 6, the portion of the plot 504 indicates how the high storage node voltage retains its level with little detrimental decay. As described above with reference to FIG. 5 and FIG. 6, the time $S_{L8}$ indicates when the SRAM cell transitions to the low standby state, and the portion of the plot 506 that occurs after the time $S_{L8}$ demonstrates no voltage decay.

Although the above description refers to an exemplary loadless 4T SRAM cell, the described techniques, methodologies, operating processes, and technologies can be equivalently applied to other SRAM cell arrangements and architectures, e.g., 6T SRAM cells. In this regard, some or all of the drive transistors in a 6T SRAM cell can employ a direct conductive connection between the gate terminal and the body terminal, as described above. Moreover, a 6T SRAM cell can be operated in the standby state by asserting a leakage-inducing voltage on its word line, as explained above. Thus, improvements in read margin and data retention can be realized in both loadless 4T SRAM cells and 6T SRAM cells.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A memory cell system comprising:
a memory cell comprising:
a first access transistor having a first gate terminal corresponding to a word line of the memory cell, a first source/drain terminal corresponding to a first bit line of the memory cell, and a first drain/source terminal corresponding to a first storage node of the memory cell;
a second access transistor having a second gate terminal corresponding to the word line of the memory cell, a second source/drain terminal corresponding to a second bit line of the memory cell, and a second drain/source terminal corresponding to a second storage node of the memory cell;
a third drive transistor having a third gate terminal coupled to the second storage node, a third drain terminal coupled to the first storage node, a third source terminal corresponding to a reference voltage, and a third body terminal directly connected to the third gate terminal; and
a fourth drive transistor having a fourth gate terminal coupled to the first storage node, a fourth drain terminal coupled to the second storage node, a fourth source terminal corresponding to the reference voltage, and a fourth body terminal directly connected to the fourth gate terminal;
a word line selection and control module operatively coupled to the memory cell; and
a sense amplifiers and decoders module operatively coupled to the memory cell;
wherein the word line selection and control module and the sense amplifiers and decoders module are controlled to enter a standby state of the memory cell by asserting a leakage-inducing voltage at the word line, asserting a first standby voltage at the first bit line, and asserting a second standby voltage at the second bit line;
wherein the first standby voltage is higher than the leakage-inducing voltage; and
wherein the second standby voltage is higher than the leakage-inducing voltage.

2. The memory cell system of claim 1, wherein:
the first access transistor is a PMOS transistor;
the second access transistor is a PMOS transistor;
the third drive transistor is an NMOS transistor; and
the fourth drive transistor is an NMOS transistor.

3. The memory cell system of claim 1, wherein the reference voltage corresponds to a ground voltage.

4. The memory cell system of claim 1, wherein the first access transistor, the second access transistor, the third drive transistor, and the fourth drive transistor are all formed on a silicon-on-insulator substrate.

5. A method of operating a memory device, the method comprising:
provide a memory cell comprising a first PMOS access transistor, a second PMOS access transistor, a first NMOS drive transistor, and a second NMOS drive transistor, wherein:
the first PMOS access transistor comprises a first gate terminal coupled to a word line of the memory device, a first source/drain terminal coupled to a first bit line of the memory device, and a first drain/source terminal corresponding to a first storage node of the memory cell;
the second PMOS access transistor comprises a second gate terminal coupled to the word line, a second source/drain terminal coupled to a second bit line of the memory device, and a second drain/source terminal corresponding to a second storage node of the memory cell;
the first NMOS drive transistor comprises a third gate terminal coupled to the second drain/source terminal, a third drain terminal coupled to the first drain/source terminal, a third source terminal coupled to a reference voltage, and a third body terminal directly connected to the third gate terminal; and
the second NMOS drive transistor comprises a fourth gate terminal coupled to the first drain/source terminal, a fourth drain terminal coupled to the second drain/source terminal, a fourth source terminal coupled to the reference voltage, and a fourth body terminal directly connected to the fourth gate terminal; and
entering a standby state of the memory cell by asserting a leakage-inducing voltage at the word line, asserting a first standby voltage at the first bit line, and asserting a second standby voltage at the second bit line, wherein the first standby voltage is higher than the leakage-inducing voltage, and the second standby voltage is higher than the leakage-inducing voltage.

6. The method of claim 5, wherein the leakage-inducing voltage is between 0.0 volts and a supply voltage used by the first NMOS drive transistor and the second NMOS drive transistor.

7. The method of claim 5, wherein the leakage-inducing voltage is approximately one-half the supply voltage used by the first NMOS drive transistor and the second NMOS drive transistor.

8. The method of claim 5, wherein:
the first standby voltage corresponds to a supply voltage used by the first NMOS drive transistor and the second NMOS drive transistor; and
the second standby voltage corresponds to the supply voltage.

9. The method of claim 5, further comprising:
de-asserting the leakage-inducing voltage from the word line;
asserting a read voltage at the word line, the read voltage being lower than the leakage-inducing voltage; and
determining a bit state of the memory cell by sensing voltages at the first storage node and the second storage node, via the first bit line and the second bit line, respectively.

10. The method of claim 9, wherein the read voltage corresponds to a ground voltage.

11. The method of claim 5, further comprising:
de-asserting the leakage-inducing voltage from the word line;
asserting a write voltage at the word line, the write voltage being lower than the leakage-inducing voltage;
asserting a high writing voltage at the first bit line; and
asserting a low writing voltage at the second bit line, wherein asserting the high writing voltage and asserting the low writing voltage results in a logic high bit state for the memory cell.

12. The method of claim 11, wherein:
the write voltage corresponds to a ground voltage; and
the high writing voltage is higher than the low writing voltage.

13. The method of claim 5, further comprising:
de-asserting the leakage-inducing voltage from the word line;
asserting a write voltage at the word line, the write voltage being lower than the leakage-inducing voltage;
asserting a low writing voltage at the first bit line; and
asserting a high writing voltage at the second bit line, wherein asserting the low writing voltage and asserting the high writing voltage results in a logic low bit state for the memory cell.

14. The method of claim 13, wherein:
the write voltage corresponds to a ground voltage; and
the high writing voltage is higher than the low writing voltage.

15. A method of operating a loadless 4T memory cell in a standby state, the memory cell comprising two PMOS access transistors and two cross-coupled NMOS drive transistors, each of the NMOS drive transistors having its gate terminal directly connected to its body terminal, and each of the NMOS drive transistors having its source terminal coupled to ground, the method comprising:
asserting a leakage-inducing voltage at a word line of the memory cell, the word line coupled to the gate terminals of the PMOS access transistors, wherein the leakage-inducing voltage causes the PMOS access transistors to leak current;
asserting a first standby voltage at a first bit line of the memory cell, the first bit line coupled to a first source/drain terminal of one of the two PMOS access transistors, the first standby voltage being higher than the leakage-inducing voltage; and
asserting a second standby voltage at a second bit line of the memory cell, the second bit line coupled to a second source/drain terminal of the other one of the two PMOS access transistors, the second standby voltage being higher than the leakage-inducing voltage.

16. The method of claim 15, wherein the leakage-inducing voltage is between 0.0 volts and a supply voltage used by the two NMOS drive transistors.

17. The method of claim 16, wherein the leakage-inducing voltage is approximately one-half the supply voltage.

18. The method of claim 15, wherein:
the first standby voltage corresponds to a supply voltage used by the two NMOS drive transistors; and
the second standby voltage corresponds to the supply voltage.

19. The method of claim 15, wherein the first standby voltage equals the second standby voltage.

* * * * *